(12) United States Patent
Kecskemeti et al.

(10) Patent No.: US 10,132,898 B2
(45) Date of Patent: Nov. 20, 2018

(54) MRI DOUBLE INVERSION RECOVERY METHOD AND SYSTEM, WITH DIFFERENT MAGNETIZATION RECOVERY STATES PROVIDING THE MRI IMAGE CONTRAST(S)

(71) Applicant: Wisconsin Alumni Research Foundation, Madison, WI (US)

(72) Inventors: Steven Ryan Kecskemeti, Madison, WI (US); Andrew L. Alexander, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1581 days.

(21) Appl. No.: 13/902,378

(22) Filed: May 24, 2013

(65) Prior Publication Data

US 2014/0347051 A1 Nov. 27, 2014

(51) Int. Cl.
*G01R 33/50* (2006.01)
*G01R 33/56* (2006.01)
*G01R 33/48* (2006.01)

(52) U.S. Cl.
CPC ...... *G01R 33/5602* (2013.01); *G01R 33/4818* (2013.01); *G01R 33/50* (2013.01)

(58) Field of Classification Search
USPC ............. 324/300–322; 600/407–435
See application file for complete search history.

(56) References Cited

U.S. PATENT DOCUMENTS

| | | | |
|---|---|---|---|
| 7,369,887 B2* | 5/2008 | Fayad | A61B 5/02007 600/413 |
| 8,112,145 B2 | 2/2012 | Grist et al. | |
| 8,664,954 B2* | 3/2014 | Hetzer | G01R 33/4818 324/309 |
| 8,700,127 B2* | 4/2014 | Salerno | A61B 5/055 600/413 |
| 9,014,783 B2* | 4/2015 | Rehwald | A61B 5/055 600/407 |
| 9,063,206 B2* | 6/2015 | Madhuranthakam | G01R 33/5602 |
| 9,360,539 B2* | 6/2016 | Carroll | G01R 33/54 |
| 9,507,001 B2* | 11/2016 | Zhang | G01R 33/543 |
| 9,588,207 B2* | 3/2017 | Weller | G01R 33/5611 |
| 2005/0010104 A1* | 1/2005 | Fayad | A61B 5/02007 600/413 |
| 2010/0191099 A1* | 7/2010 | Salerno | A61B 5/055 600/420 |
| 2010/0268066 A1* | 10/2010 | Rehwald | A61B 5/055 600/419 |

(Continued)

*Primary Examiner* — Melissa Koval
*Assistant Examiner* — Tiffany Fetzner
(74) *Attorney, Agent, or Firm* — Quarles & Brady LLP (57) ABSTRACT

Described here are a system and method for obtaining multiple different images when performing a single scan of a subject with a magnetic resonance imaging ("MRI") system. The scan includes the application of two or more magnetization preparation radio frequency ("RF") pulses, such as inversion recovery ("IR") pulses. Data is acquired after the application of each magnetization preparation RF pulse, thus allowing the acquisition of multiple different images of the subject in a single scan. Using this approach, the same information that used to require multiple different scans of the subject can be acquired in one single scan, and in less time than would be required to perform the multiple scans.

15 Claims, 7 Drawing Sheets

(56) References Cited

U.S. PATENT DOCUMENTS

| | | | | |
|---|---|---|---|---|
| 2012/0013336 A1* | 1/2012 | Hetzer | ............... | G01R 33/4818 |
| | | | | 324/309 |
| 2012/0262169 A1* | 10/2012 | Madhuranthakam | ........................ | |
| | | | | G01R 33/5602 |
| | | | | 324/309 |
| 2013/0088225 A1* | 4/2013 | Weller | ............... | G01R 33/5611 |
| | | | | 324/307 |
| 2013/0342204 A1* | 12/2013 | Zhang | .................. | G01R 33/543 |
| | | | | 324/309 |
| 2014/0062477 A1* | 3/2014 | Carroll | ............... | G01R 33/4826 |
| | | | | 324/309 |
| 2014/0347051 A1* | 11/2014 | Kecskemeti | ....... | G01R 33/5602 |
| | | | | 324/309 |
| 2017/0156630 A1* | 6/2017 | Gabr | ................... | A61B 5/0013 |

\* cited by examiner

MRI DOUBLE INVERSION RECOVERY METHOD AND SYSTEM, WITH DIFFERENT MAGNETIZATION RECOVERY STATES PROVIDING THE MRI IMAGE CONTRAST(S)

STATEMENT REGARDING FEDERALLY SPONSORED RESEARCH

This invention was made with government support under MH084051 and HD003352 awarded by the National Institutes of Health. The government has certain rights in the invention.

BACKGROUND OF THE INVENTION

The field of the invention is magnetic resonance imaging systems and methods. More particularly, the invention relates to a system and method for magnetic resonance imaging in which two or more magnetization preparation radio frequency pulses are utilized, such as double inversion recovery magnetic resonance imaging.

When a substance such as human tissue is subjected to a uniform magnetic field, $B_0$, applied along, for example, the z-axis of a Cartesian coordinate system, the individual magnetic moments of the spins in the tissue attempt to align with this magnetic field, $B_0$, but precess about the field in random order at their characteristic Larmor frequency. If the substance, or tissue, is subjected to a magnetic field, $B_1$, that is applied in the x-y plane and that is near the Larmor frequency of the spins, the net aligned moment, $M_z$, may be rotated, or "tipped," into the x-y plane to produce a net transverse magnetic moment, $M_{xy}$. A magnetic resonance signal is emitted by the excited spins after the excitation field, $B_1$, is terminated. This magnetic resonance signal may be received and processed to form an image or to produce a spectrum.

The magnetic resonance signals acquired with an MRI system are signal samples in Fourier space, or what is often referred to in the art as "k-space." Typically, a region to be imaged is scanned by a sequence of measurement cycles in which magnetic field gradients vary according to the particular localization method being used. Each measurement cycle, or pulse sequence, typically samples a portion of k-space along a sampling trajectory characteristic of that pulse sequence. This is accomplished by employing magnetic field gradients ($G_x$, $G_y$, and $G_z$) that have the same direction as the polarizing magnetic field, $B_0$, but which have a gradient along the respective x, y, and z axes. By controlling the strength of these gradients during each measurement cycle, the spatial distribution of spin excitation can be controlled and the location of the resulting magnetic resonance signals can be identified. The acquisition of the magnetic resonance signal samples is referred to as sampling k-space, and a scan is completed when enough measurement cycles are performed to adequately sample k-space. The resulting set of received magnetic resonance signals are digitized and processed to reconstruct the image using one of many well known reconstruction techniques.

Inversion recovery ("IR") techniques are commonly used in MRI to either increase signal contrast between tissues, or otherwise null the signals originating from particular tissue types. IR acquisitions use the application of an inversion recovery radio frequency ("RF") pulse before the application of an excitation RF pulse and subsequent data acquisition. The duration of time between the IR RF pulse and the excitation RF pulse is referred to as the inversion time ("TI"). The contrast of IR techniques is modulated by the $T_1$ (spin-lattice) relaxation time. The TI is selected before the MRI scan begins and determines the image contrast. Signal nulling with IR techniques is performed by selecting the TI that corresponds to the time point with roughly zero longitudinal magnetization.

As an example, IR techniques are commonly performed in brain imaging applications in order to significantly reduce, or otherwise null, the magnetic resonance signals attributable to cerebrospinal fluid ("CSF"). A double (also called dual) IR ("DIR") technique applies two inversion recovery RF pulses in succession, such that two tissues are simultaneously nulled at a time $TI_2$ following the second inversion recovery pulse. In the brain, DIR techniques are usually set to null signals from both white matter and CSF, producing images of gray matter. The acquisition time of whole-brain DIR images is typically on the order of 10-15 minutes, which is long in a clinical setting. Furthermore, the DIR technique is usually performed in addition to a separate single IR acquisition, which provides $T_1$-weighted images of the brain. As such, the acquisition of both a DIR and an IR image typically requires 14-23 minutes. DIR image acquisitions, however, provide useful information, and are particularly suitable for assessing certain diseases including multiple sclerosis ("MS"), epilepsy, and plaque build-up in carotid arteries. As a result, DIR acquisitions are often included in MRI brain scans for MS patients.

It would therefore be desirable to provide systems and methods for MRI that are capable of acquiring multiple different images representative of different recovery states of magnetization in a shorter amount of scan time that can currently be achieved.

SUMMARY OF THE INVENTION

The present invention overcomes the aforementioned drawbacks by providing systems and methods for magnetic resonance imaging ("MRI") in which pulse sequences that utilize multiple magnetization preparation radio frequency ("RF") pulses are modified so as to acquire multiple sets of data attributable to different images of the subject. In doing so, multiple different scans of the subject can be condensed into one, single scan that requires less time to perform than the multiple different scans combined.

It is an aspect of the invention to provide a method for producing at least two images of a subject with an MRI system. The MRI system is directed to perform a pulse sequence that, during each repetition time ("TR") interval, includes the following. A first magnetization preparation RF pulse is applied to manipulate magnetization attributable to a spin species, and a second magnetization preparation RF pulse is applied to further manipulate the magnetization attributable to the spin species. First data is acquired after applying the first magnetization preparation RF pulse and before applying the second magnetization preparation RF pulse, and second data is acquired after applying the second magnetization preparation RF pulse. The method also includes reconstructing at least one image of the subject from the first data and reconstructing at least one image of the subject from the second data.

It is another aspect of the invention to provide a method for producing a plurality of images of a subject with an MRI system. The MRI system is directed to apply a plurality of magnetization preparation RF pulses, each magnetization preparation RF pulse rotating magnetization through a flip angle. After each of the plurality of magnetization preparation RF pulses is applied, k-space data is acquired by applying at least one excitation RF pulse after each of the plurality of magnetization preparation RF pulses and by sampling magnetic resonance signals formed in response to those excitation RF pulses. A plurality of images of the subject are then reconstructed from the acquired k-space data.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for magnetic resonance imaging ("MRI") using two or more magnetization preparation radio frequency ("RF") pulses, such as two or more inversion recovery ("IR") pulses. The systems and methods of the present invention are thus capable of acquiring multiple sets of IR data in a single scan. As one example, the systems and methods are capable of acquire both double IR ("DIR") data and single IR data in the same scan. The total scan time achievable with the present invention is significantly reduced as compared to acquiring separate DIR and IR scans required with conventional techniques. Using existing techniques, it takes a total of 14-22 minutes to perform both a single IR scan and a DIR scan. Using the systems and methods of the present invention, both single IR data and DIR data can be obtained in a single scan that takes about 10-15 minutes to complete.

Current DIR techniques apply an IR radio frequency ("RF") pulse, wait a specified amount of time, apply a second IR RF pulse, and then begin sampling magnetic resonance signals at a specified time after the second IR RF pulse is applied. The first and second specified time are selected before the MRI scan is performed such that data is acquired when two tissues with different $T_1$ values are nulled, or otherwise significantly reduced. As an example, the specified times can be selected such that white matter and cerebrospinal fluid are nulled when data is acquired. The magnetization is usually allowed to regrow before the imaging process is repeated again. DIR is attractive because it is better able to depict intracortical lesions, such as those associated with multiple sclerosis, due to the high gray matter-white matter contrast achievable with DIR acquisitions.

The systems and methods of the present invention are fundamentally different than existing techniques because data is acquired after each IR RF pulse. In conventional DIR, the interval between the first and second IR RF pulses is merely a waiting period during which no data acquisition occurs. Using the systems and methods of the present invention, however, data is additionally acquired after the first IR RF pulse.

By way of example, data can be acquired after the first IR RF pulse using a technique such as those described in co-pending U.S. patent application Ser. No. 13/829,260, which is herein incorporated by reference in its entirety, to produce a spectrum of hundreds of images (e.g. 200-500) images each having a different $T_1$ contrast, one of which has contrast similar to a typical $T_1$-weighted exam. An example of the data acquisition technique described in U.S. patent application Ser. No. 13/829,260 is also provided in more detail below. The systems and methods of the present invention can thus employ a unique data acquisition scheme that allows for the retrospective identification of an image having an optimal tissue contrast. In these implementations, data acquisition is performed using a radial acquisition scheme such as, preferably, a vastly undersampled isotropic projection reconstruction ("VIPR") scheme.

Alternatively, data can be acquired following each IR pulse using conventional Cartesian k-space sampling or other sampling trajectories, including radials, spirals, twirls, sinusoids, and so on. As will be described below, the sampling schemes may be different following each magnetization preparation RF pulse.

One advantage of the present invention is that multiple images with different contrast characteristics can be obtained in a single scan. For example, current brain imaging protocols require two separate scans to obtain a $T_1$-weighted image and an image in which signals from cerebrospinal fluid are suppressed. With the systems and methods of the present invention, however, both a $T_1$-weighted image and an image in which signals from cerebrospinal fluid are suppressed can be obtained in a single scan, thereby providing a significant time saving for the subject being imaged and increasing subject throughput.

Another advantage of the present invention is that a single $T_1$-weighted image can be obtained in addition to a plurality of images each having different image contrasts, a so-called "spectrum" of images, in which the different image contrasts are defined by the recovery of magnetization following a double IR technique. In this manner, a subject and disease specific optimized image contrast can be achieved because, rather than trying to predict what imaging parameters will produce the best contrast for a particular subject, multiple images across a wide range of contrast settings can be acquired. This can be useful for many different applications, including pediatric imaging.

The method of the present invention can also be advantageously used for $T_1$ quantification. The methods described here can sample data along a recovery curve that can be modeled and fitted to match the data. This allows the $T_1$ value, a fundamental parameter describing tissue, to be accurately quantified. Being able to obtain an accurate measurement of $T_1$ allows for new biomarkers for classifying and monitoring progression of illnesses and normal development with new tools not currently available on commercial scanners.

In general, a pulse sequence that implements the present invention includes a plurality of magnetization preparation RF pulses, each followed by a data acquisition, and all occurring within a single repetition time ("TR") interval. For instance, a pulse sequence that implements the present invention may include a first magnetization preparation RF pulse followed by a first data acquisition, and a second magnetization preparation RF pulse followed by a second data acquisition. By way of example, the magnetization RF pulses can each be IR RF pulses. Unlike previous multiple IR methods, the method of the present invention acquires data as longitudinal magnetization is recovering following the application of each IR RF pulse. In other implementations, the magnetization preparation RF pulses may be saturation RF pulses or magnetization transfer RF pulses. The magnetization preparation RF pulses may be spatially selective, spectrally selective, or non-selective.

Figure 1:
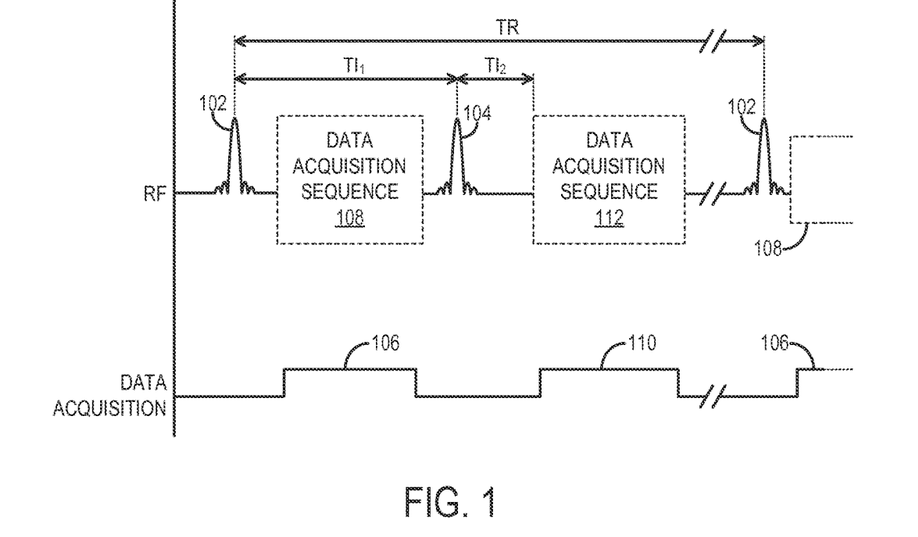
FIG. 1 is an example of a pulse sequence that implements embodiments of the present invention.

An example of a pulse sequence that implements the present invention is illustrated in FIG. 1. In this example, the pulse sequence includes a first magnetization preparation RF pulse 102 followed by a second magnetization preparation RF pulse 104. By way of example, these magnetization preparation RF pulses are both IR pulses that are designed to rotate longitudinal magnetization by a flip angle, $\beta$. The flip angle, $\beta$, is preferably at or near 180 degrees; however, it will be appreciated that other flip angles, $\beta$, can also be used depending on the imaging application at task, the desired effect on longitudinal magnetization, and considerations for optimizing total scan time. In some instances, the magnetization preparation RF pulses 102, 104 can have different flip angles, $\beta_1$ and $\beta_2$. The first and second magnetization preparation RF pulses 102, 104 are separated in time by a first inversion time, $TI_1$.

Figure 2A:
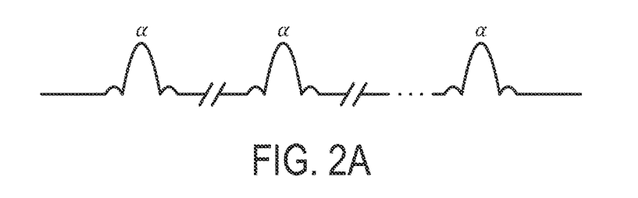
FIGS. 2A-2C illustrate examples of a series of excitation radio frequency ("RF") pulses that can be used in the data acquisition sequences of the pulse sequence illustrated in FIG. 1.
Figure 2B:
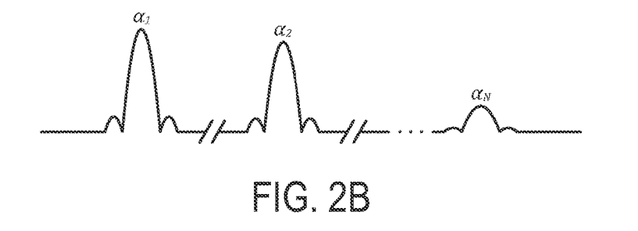
Figure 2C:
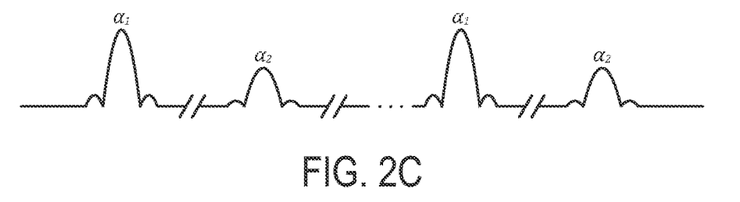

Unlike conventional DIR pulses sequences, after the application of the first magnetization preparation RF pulse 102 and before the application of the second magnetization preparation RF pulse 104, data is acquired from the subject being imaged, as indicated by data acquisition block 106. Data acquisition commences with the performance of a data acquisition sequence 108. By way of example, data acquisition sequence 108 includes multiple excitation RF pulses. The excitation RF pulses can each have the same flip angle, $\alpha$, as illustrated by way of example in FIG. 2A; can each have different flip angles, $\alpha_n$, for N different excitation RF pulses, as illustrated by way of example in FIG. 2B; or can have any combination of similar and different flip angles, such as an interleaving of two different flip angles, $\alpha_1$ and $\alpha_2$, as illustrated by way of example in FIG. 2C. The choice of flip angles will depend on the imaging application at task, the desired effect on magnetization, and considerations for optimizing total scan time.

After the application of the second magnetization preparation RF pulse 104, data is acquired from the subject being imaged, as indicated by data acquisition block 110. Data acquisition commences with the performance of a data acquisition sequence 112. By way of example, data acquisition sequence 112 includes multiple excitation RF pulses. The excitation RF pulses can each have the same flip angle, $\alpha$, as illustrated by way of example in FIG. 2A; can each have different flip angles, $\alpha_n$, for N different excitation RF pulses, as illustrated by way of example in FIG. 2B; or can have any combination of similar and different flip angles, such as an interleaving of two different flip angles, $\alpha_1$ and $\alpha_2$, as illustrated by way of example in FIG. 2C. The choice of flip angles will depend on the imaging application at task, the desired effect on magnetization, and considerations for optimizing total scan time. The second magnetization RF pulse 104 and the beginning of the data acquisition sequence 112 are separated in time by a second inversion time, $TI_2$.

In some configurations, one of the data acquisition sequences 108, 112 may include only a single excitation RF pulse. If a single excitation RF pulse with a flip angle at or near ninety degrees is employed in the first data acquisition sequence 108, the second inversion time, $TI_2$, is preferably lengthened relative to a sequence that makes use of multiple excitation RF pulses with small flip angles. The reasoning for lengthening the second inversion time, $TI_2$, when using only a single excitation RF pulse with a flip angle at or near ninety degrees in the first data acquisition sequence 108 is to allow additional time for longitudinal magnetization to regrow before the commencement of the second data acquisition sequence 112. If a single excitation RF pulse having a flip angle at or near ninety degrees is employed in the second data acquisition sequence 112, and not the first data acquisition sequence 108, then this lengthening of the second inversion time, $TI_2$, may not be necessary.

In general, the data acquisition sequences 108, 112 can sample k-space in any one of a number of different manners. For example, when acquiring data throughout the magnetization recovery using the data acquisition techniques described in co-pending U.S. patent application Ser. No. 13/829,260, k-space is sampled along three-dimensional radial trajectories. Other k-space sampling patterns can also be used, however. As another example, Cartesian sampling can be implemented. For application where Cartesian sampling is implemented, typically data associated with only one image will be acquired during the data acquisition sequence that utilizes Cartesian sampling. Thus, when Cartesian sampling is implemented it is preferable that an inversion time be selected prior to performing the scan, as is done with conventional IR methods. By way of example, the first data acquisition sequence 108 could implement a Cartesian sampling pattern to obtain a single, $T_1$-weighted image while the second data acquisition sequence 112 could implement the three-dimensional radial sampling technique described in co-pending U.S. patent application Ser. No. 13/829,260 to obtain a spectrum of images each having different image contrasts. As another example, the first data acquisition sequence 108 could implement the three-dimensional radial sampling technique described in co-pending U.S. patent application Ser. No. 13/829,260 to obtain a spectrum of images each having different image contrasts and the second data acquisition sequence 112 could implement a Cartesian sampling pattern to obtain a single, DIR image.

The pulse sequence is repeated until the desired amount of data has been acquired. For each TR interval, data associated with one or more images are obtained during the first data acquisition sequence 108 and data associated with one or more images are obtained during the second data acquisition sequence 112.

By way of example, the data acquired in the first data acquisition sequence 108 can be reconstructed to form a single, $T_1$-weighted image of the subject. Alternatively, if the data acquisition techniques described in co-pending U.S. patent application Ser. No. 13/829,260 are implemented during the first data acquisition sequence 108, then the data acquired in the first data acquisition sequence 108 can be reconstructed to form a plurality of different images, each having a different image contrast determined by the recovery of longitudinal magnetization back to equilibrium following the application of the first magnetization preparation RF pulse 102.

By way of example, the data acquired in the second data acquisition sequence 112 can be reconstructed to form a single, DIR image of the subject in which signals from two different tissues are significantly reduced, or otherwise nulled. Alternatively, if the data acquisition techniques described in co-pending U.S. patent application Ser. No. 13/829,260 are implemented during the second data acquisition sequence 112, then the data acquired in the second data acquisition sequence 112 can be reconstructed to form a plurality of different images, each having a different image contrast determined by the recovery of longitudinal magnetization back to equilibrium following the application of the second magnetization preparation RF pulse 104.

It will be appreciated that the example pulse sequence illustrated in FIG. 1 can be readily adapted to account for more than two magnetization preparation RF pulses. For instance, triple IR ("TIR") or quadruple ("QIR") imaging can be achieved, in which data is acquired following the application of two or more of three or four different IR RF pulses, respectively, per each TR interval. Thus, generally, N data acquisitions can be performed following the application of N different magnetization preparation RF pulses, such as N different IR RF pulses.

Figure 3:
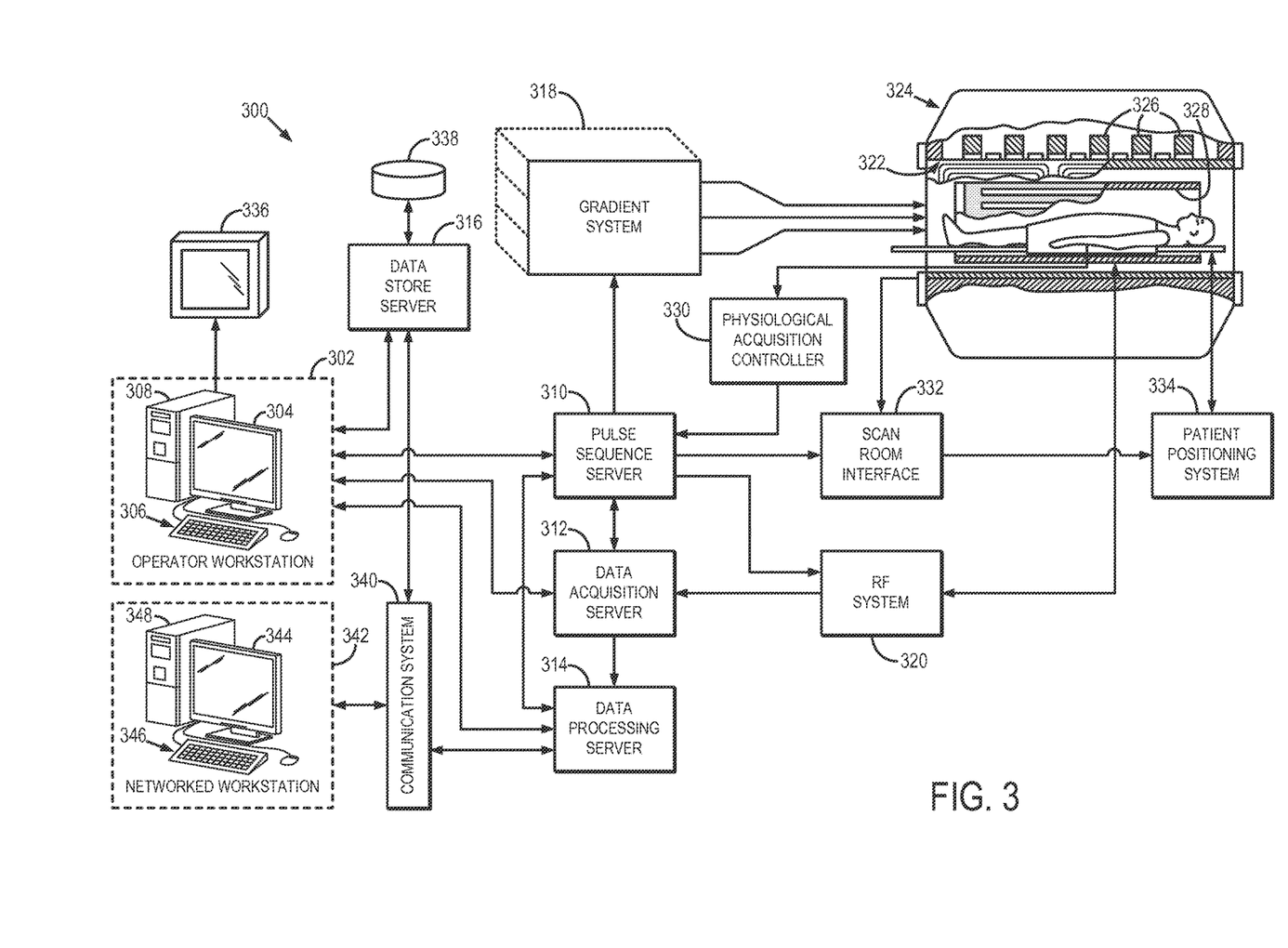
FIG. 3 is a block diagram of an example of a magnetic resonance imaging ("MRI") system.

Referring particularly now to FIG. 3, an example of an MRI system 300 that can implement the present invention is illustrated. The MRI system 300 includes a workstation 302 having a display 304 and a keyboard 306. The workstation 302 includes a processor 308, such as a commercially available programmable machine running a commercially available operating system. The workstation 302 provides the operator interface that enables scan prescriptions to be entered into the MRI system 300. The workstation 302 is coupled to four servers: a pulse sequence server 310; a data acquisition server 312; a data processing server 314; and a data store server 316. The workstation 302 and each server 310, 312, 314, and 316 are connected to communicate with each other.

The pulse sequence server 310 functions in response to instructions downloaded from the workstation 302 to operate a gradient system 318 and an RF system 320. Gradient waveforms used to perform the prescribed scan are produced and applied to the gradient system 318, which excites gradient coils in an assembly 322 to produce the magnetic field gradients $G_x$, $G_y$, and $G_z$ used for position encoding magnetic resonance signals. The gradient coil assembly 322 forms part of a magnet assembly 324 that includes a polarizing magnet 326 and a whole-body RF coil 328.

RF excitation waveforms are applied to the RF coil 328, or a separate local coil (not shown in FIG. 3), by the RF system 320 to perform the prescribed magnetic resonance pulse sequence. Responsive magnetic resonance signals detected by the RF coil 328, or a separate local coil (not shown in FIG. 3), are received by the RF system 320, amplified, demodulated, filtered, and digitized under direction of commands produced by the pulse sequence server 310. The RF system 320 includes an RF transmitter for producing a wide variety of RF pulses used in magnetic resonance pulse sequences. The RF transmitter is responsive to the scan prescription and direction from the pulse sequence server 310 to produce RF pulses of the desired frequency, phase, and pulse amplitude waveform. The generated RF pulses may be applied to the whole body RF coil 328 or to one or more local coils or coil arrays (not shown in FIG. 3).

The RF system 320 also includes one or more RF receiver channels. Each RF receiver channel includes an RF preamplifier that amplifies the magnetic resonance signal received by the coil 328 to which it is connected, and a detector that detects and digitizes the I and Q quadrature components of the received magnetic resonance signal. The magnitude of the received magnetic resonance signal may thus be determined at any sampled point by the square root of the sum of the squares of the I and Q components:

$$M=\sqrt{I^2+Q^2} \tag{1}$$

and the phase of the received magnetic resonance signal may also be determined:

$$\varphi = \tan^{-1}\left(\frac{Q}{I}\right). \tag{2}$$

The pulse sequence server 310 also optionally receives patient data from a physiological acquisition controller 330. The controller 330 receives signals from a number of different sensors connected to the patient, such as electrocardiograph ("ECG") signals from electrodes, or respiratory signals from a bellows or other respiratory monitoring device. Such signals are typically used by the pulse sequence server 310 to synchronize, or "gate," the performance of the scan with the subject's heart beat or respiration. For instance, the application of the magnetization preparation RF pulses, such as the first magnetization preparation RF pulse applied in each TR interval, can be timed relative to an ECG signal so that data acquisitions will occur during specified cardiac phases.

The pulse sequence server 310 also connects to a scan room interface circuit 332 that receives signals from various sensors associated with the condition of the patient and the magnet system. It is also through the scan room interface circuit 332 that a patient positioning system 334 receives commands to move the patient to desired positions during the scan.

The digitized magnetic resonance signal samples produced by the RF system 320 are received by the data acquisition server 312. The data acquisition server 312 operates in response to instructions downloaded from the workstation 302 to receive the real-time magnetic resonance data and provide buffer storage, such that no data is lost by data overrun. In some scans, the data acquisition server 312 does little more than pass the acquired magnetic resonance data to the data processor server 314. However, in scans that require information derived from acquired magnetic resonance data to control the further performance of the scan, the data acquisition server 312 is programmed to produce such information and convey it to the pulse sequence server 310. For example, during prescans, magnetic resonance data is acquired and used to calibrate the pulse sequence performed by the pulse sequence server 310. Also, navigator signals may be acquired during a scan and used to adjust the operating parameters of the RF system 320 or the gradient system 318, or to control the view order in which k-space is sampled. In all these examples, the data acquisition server 312 acquires magnetic resonance data and processes it in real-time to produce information that is used to control the scan.

The data processing server 314 receives magnetic resonance data from the data acquisition server 312 and processes it in accordance with instructions downloaded from the workstation 302. Such processing may include, for example: Fourier transformation of raw k-space data to produce two or three-dimensional images; the application of filters to a reconstructed image; the performance of a back-projection image reconstruction of acquired magnetic resonance data; the generation of functional magnetic resonance images; and the calculation of motion or flow images.

Images reconstructed by the data processing server 314 are conveyed back to the workstation 302 where they are stored. Real-time images are stored in a data base memory cache (not shown in FIG. 3), from which they may be output to operator display 312 or a display 336 that is located near the magnet assembly 324 for use by attending physicians. Batch mode images or selected real time images are stored in a host database on disc storage 338. When such images have been reconstructed and transferred to storage, the data processing server 314 notifies the data store server 316 on the workstation 302. The workstation 302 may be used by an operator to archive the images, produce films, or send the images via a network to other facilities.

An example of the data acquisition technique described in co-pending U.S. patent application Ser. No. 13/829,260 is now provided in more detail. This technique provides two-dimensional or three-dimensional magnetic resonance imaging that allows improved flexibility in creating segments and in spacing TRs. In this technique, any number of consecutive projections can be combined to improve image quality. The number of consecutive projections to be combined can be chosen after the data has been acquired, thereby providing for the retrospective combination data. Furthermore, the set of a desired number of projections can be selectively adjusted by a single TR, thereby allowing for the effective inversion time to be adjusted by a given, even single, TR. Multiple sequential TRs can thus have increasing inversion times. It is noted that the transverse magnetization prior to each excitation can be spoiled using, for example, variable RF phase or gradient pulses; although, magnetization spoiling is not essential. The choice of whether to use spoiling, however, will affect image contrast.

By way of example, a clinician may choose to use eight consecutively acquired projections to reconstruct an image. If so, these projections are combined together as a data segment, $S_1$. Because this segment includes projections $P_1$ through $P_8$, its average inversion time, TI, is determined by 1+2+3+4+5+6+7+8, or 36TR, divided by 8. If the clinician then selected projections $P_2$ through $P_9$ as the next data segment, $S_2$, this next data segment will have a TI determined by 2+3+4+5+6+7+8+9, or 44TR, divided by 8. Notably the TI spacing of 44TR/8−36TR/8 is equal to 8TR/8, which is the TR between each data frame.

Figure 4A:
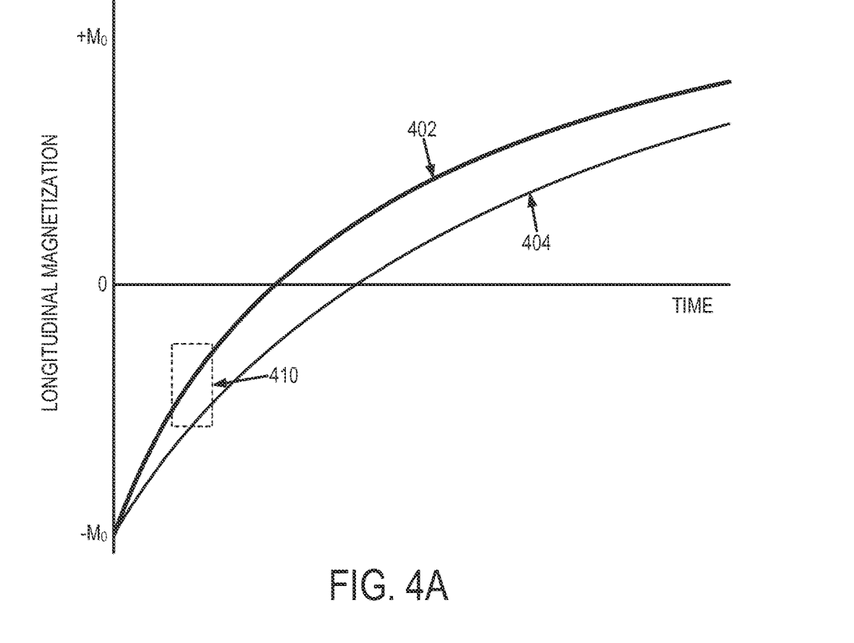
FIG. 4A is an illustration of longitudinal magnetization recovery curves for two different tissue types, such as white matter and gray matter.
Figure 4B:
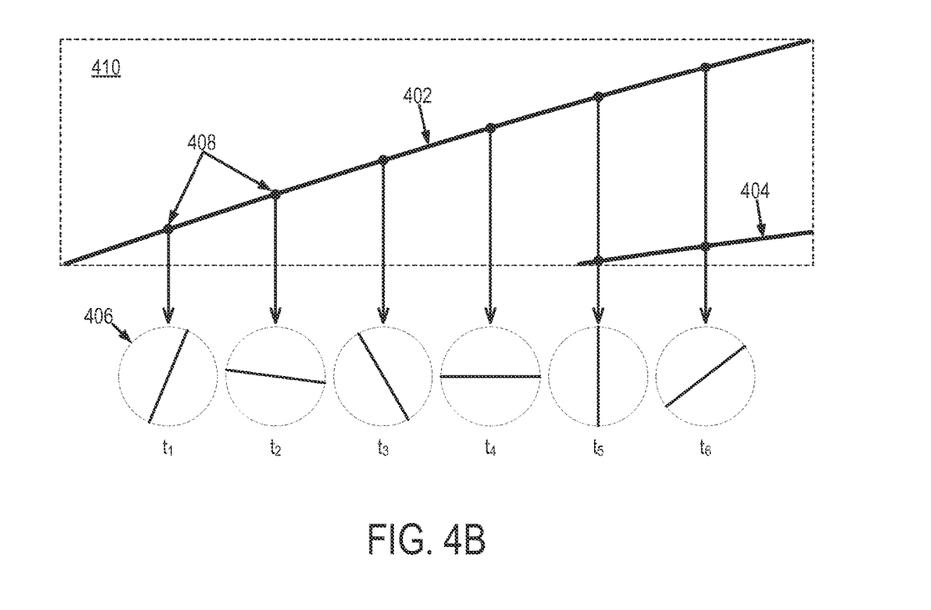
FIG. 4B is an illustration of a sampling scheme that can be implemented to sampling k-space while longitudinal magnetization is recovering back to equilibrium.

An example of this data acquisition scheme is illustrated in FIGS. 4A and 4B. In FIG. 4A, the magnetization recovery curves 402, 404 for two different tissue types following the application of an IR pulse are illustrated. By way of example, curve 402 may correspond to white matter and curve 404 may correspond to gray matter. Data is acquired as a series of consecutive radial projections, either in two-dimensions or, preferably, in three-dimensions. As illustrated in FIG. 4B, data may be acquired by sampling k-space along a single projection 406 at each temporal sampling point, $t_n$, 408. FIG. 4B illustrates an example of data acquired during a particular time window 410.

Advantageously, the view ordering used during data acquisition is selected such that subsets of consecutively acquired projections substantially uniformly sample three-dimensional k-space during a time window 410 of any suitable duration. As a result, any subset of consecutively acquired projections can be selected as a data segment while still maintaining a uniform sampling of k-space. This flexibility allows for finer temporal resolution than achievable with previous projection-based IR imaging methods. For instance, temporal resolutions on the order of five milliseconds are obtainable with the present invention.

Figure 5:
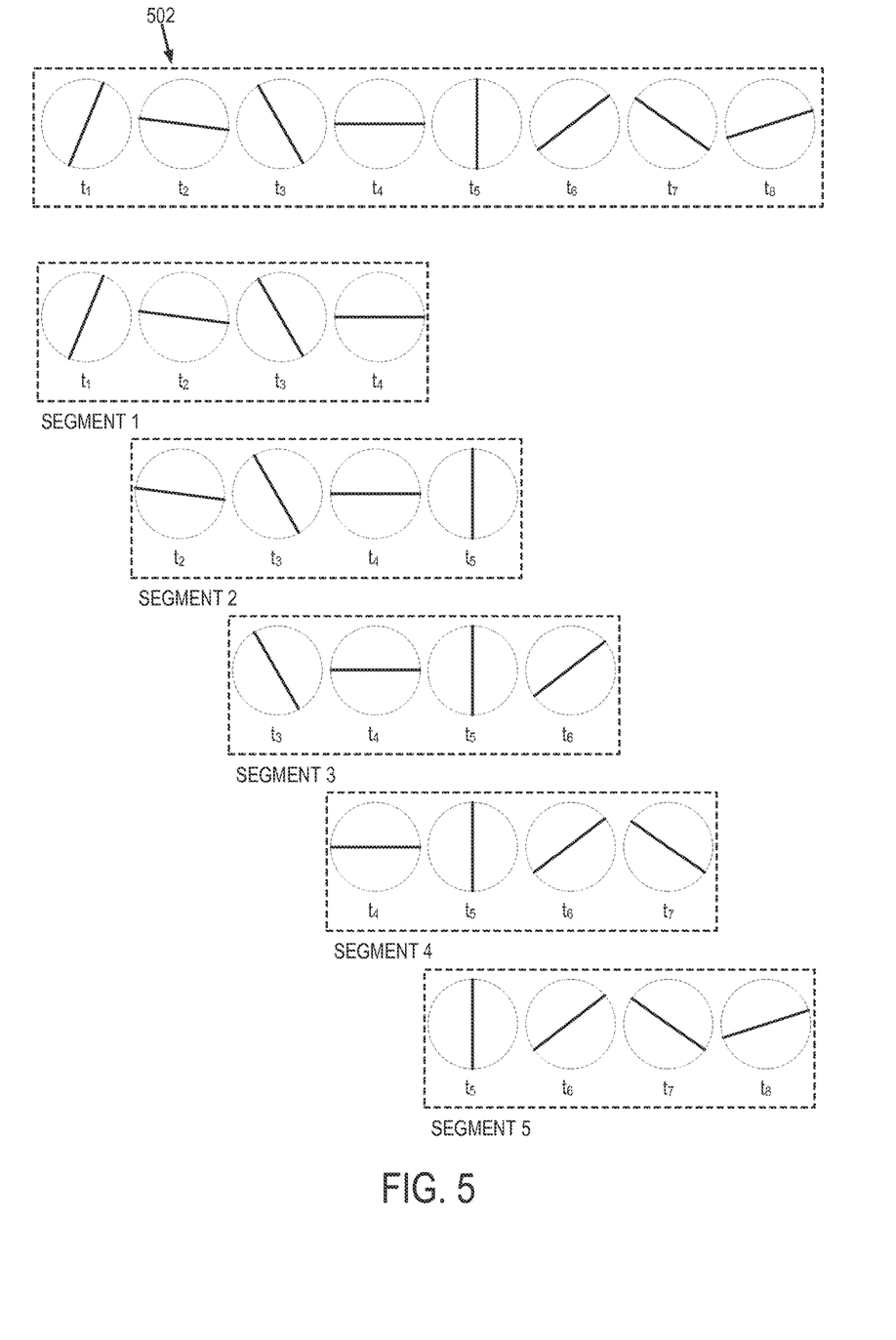
FIG. 5 is an illustration of a grouping of consecutively acquired radial projections into data segments that are temporally shifted by a selected time shift, such as one repetition time period.

As noted above, images are reconstructed from those projections contained within a sliding temporal window that can be selected by the user after data acquisition has occurred. This process is illustrated in FIG. 5 for a series of eight consecutive projections 502 acquired at time points $t_1, \ldots, t_8$ and with a temporal window that includes four projections. In general, the temporal window can be slid one TR period for each image to be reconstructed, as is illustrated in FIG. 5 and described above. This advantageous feature of the present invention allows for the reconstruction of a time series of images that depict changing image contrast as longitudinal magnetization recovers following the application of one or more IR pulses with high temporal resolution. Because these images can be reconstructed with such a fine temporal resolution, the images may be referred to as a "spectrum of images" that span a range of unique image contrasts.

Figure 6A:
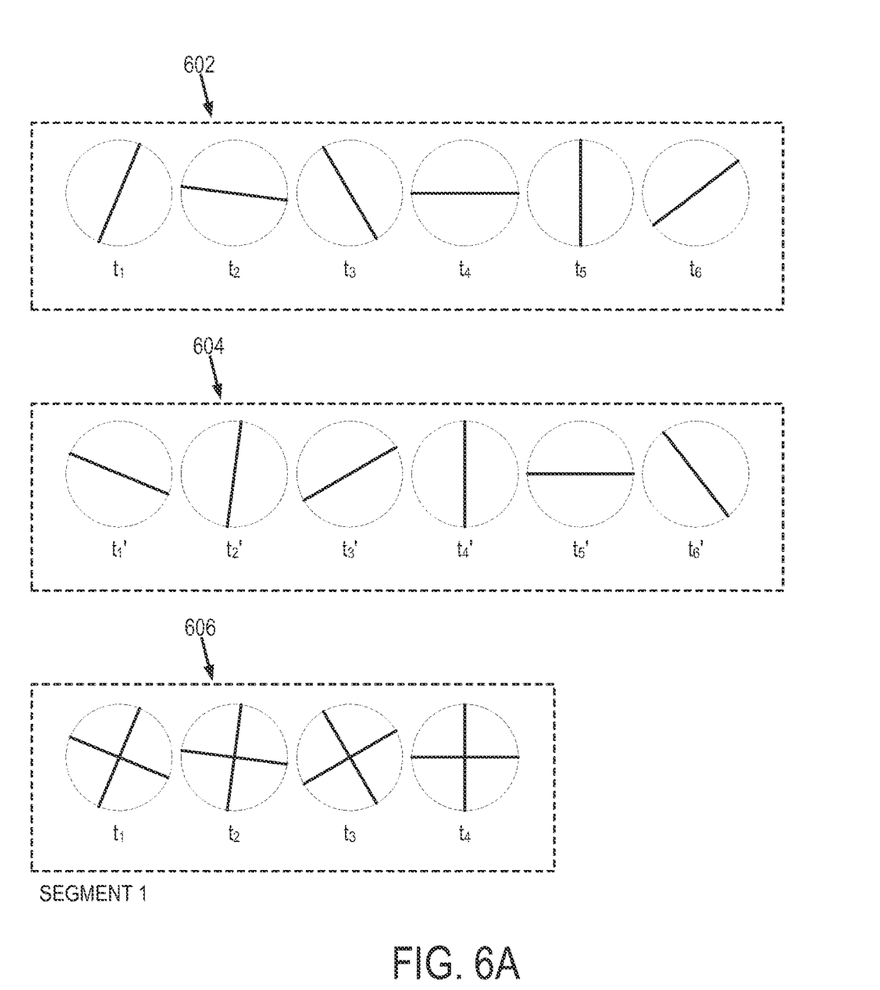
FIG. 6A is an illustration of combining data segments from two different data acquisition sequences.

Multiple inversion recovery sequences can also be performed, with the sampling between repetitions differing, as illustrated in FIG. 6A. Advantageously, data from the equivalent time points in these multiple data acquisitions can be combined to improve the quality of the images reconstructed. For instance, as illustrated in FIG. 6A, data during the first acquisition 602 can be later combined with data from the second acquisition 604 to form a data segment 606. In this instance, the data from time points $t_1$ and $t_1'$ are combined, the data from time points $t_2$ and $t_2'$ are combined, the data from $t_3$ and $t_3'$ are combined, and the data from time points $t_4$ and $t_4'$ are combined.

Figure 6B:
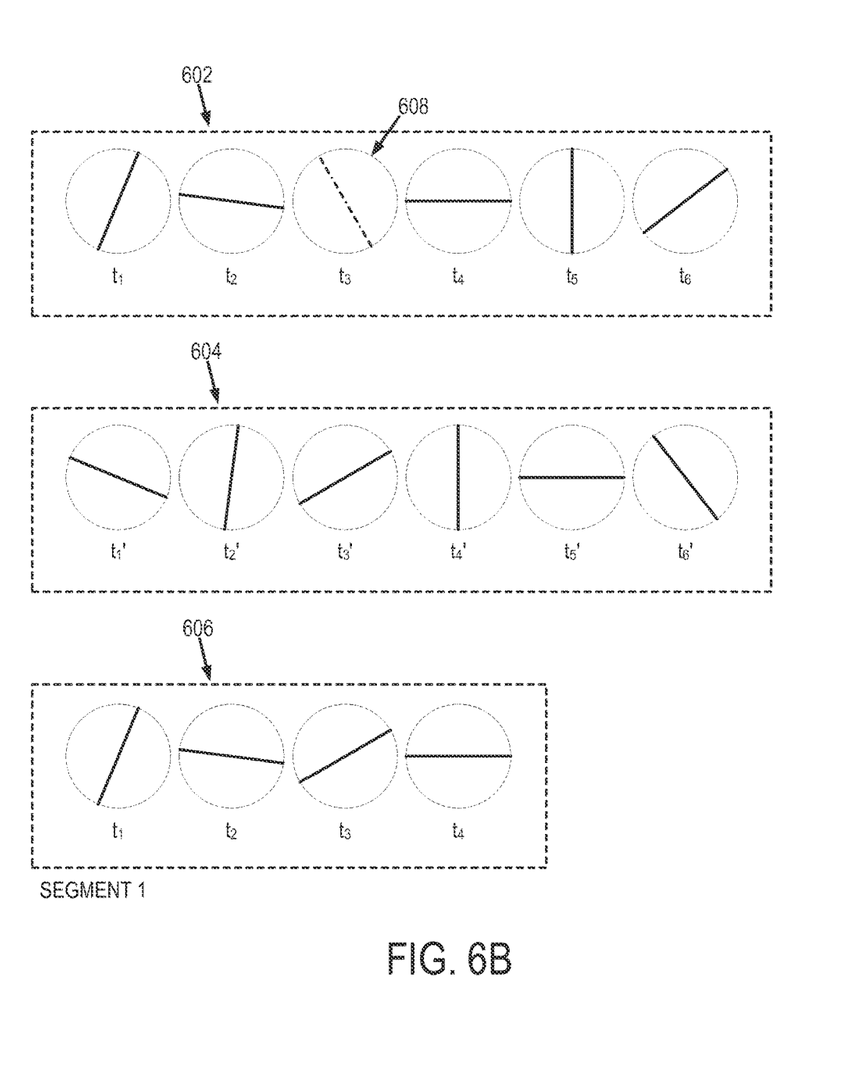
FIG. 6B is an illustration of replacing corrupted data in a data segment formed from a first data acquisition sequence with data in a data segment formed from a second data acquisition sequence.

Also, as illustrated in FIG. 6B, when there is a corrupted projection, such as projection 608 acquired at time $t_3$ from one inversion recovery acquisition, then the projection from the corresponding time point in the second inversion recovery acquisition, such as the projection acquired at time point $t_3'$, can be substituted for the corrupt data. An example of corrupted data includes motion-corrupted data.

Figure 7:
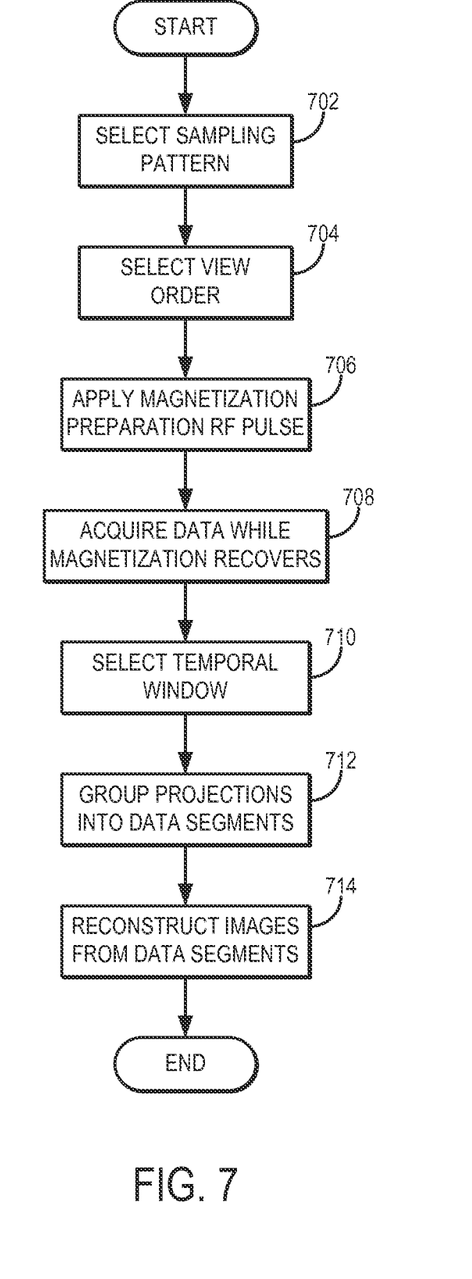
FIG. 7 is a flowchart setting forth the steps of an example of a method for acquiring data in a data acquisition sequence using a radial acquisition scheme that sampled k-space while magnetization is recovering back to equilibrium.

Referring now to FIG. 7, a flowchart setting forth the steps of an example of a method for acquiring data following the application of a magnetization preparation RF pulse, such as an IR RF pulse, that implements the techniques described in co-pending U.S. patent application Ser. No. 13/829,260, is illustrated. It is noted that this method could be implemented for one or more of the data acquisition sequences in a single TR interval in accordance with embodiments of the present invention. The method generally includes a two-dimensional or three-dimensional data acquisition that samples k-space at a series of radial projections. The method thus begins with the selection of the k-space sampling pattern to be used to acquire data in a given data acquisition sequence, as indicated at step 702. By way of example, the sampling pattern may include a plurality of radial projections, which may be two-dimensional radial projections or three-dimensional radial projections. For instance, the sampling pattern could be defined in accordance with so-called vastly undersampling isotropic projection ("VIPR") imaging schemes. It is noted that different sampling patterns may be selected for different data acquisition sequences included in the single MRI scan. Then, as indicated at step 704, the view ordering used for each sampling pattern is selected. This view ordering is selected such that for any group of consecutively acquired radial projections containing at least a selected number of radial projections, those radial projections will be substantially uniformly distributed in k-space.

During the MRI scan of the subject, a magnetization preparation RF pulse, such as an IR RF pulse, associated with a given data acquisition sequence is applied, as indicated at step 706. While magnetization is recovering back to equilibrium following the application of the magnetization preparation RF pulse, k-space data is acquired from the subject in accordance with the sampling pattern and view ordering selected for the given data acquisition sequence, as indicated at step 708.

By way of example, k-space data is acquired as described above; namely, by sampling k-space along one or more radial projections during a the data acquisition sequence. A series of consecutive radial projections are sampled in this manner. Preferably, the radial projections are selected such that a selected number of consecutive radial projections substantially uniformly sample two-dimensional or three-dimensional k-space.

After all of the desired k-space data for a given data acquisition sequence have been acquired, a temporal window is selected, as indicated at step 710. This temporal window defines how many consecutively acquired projections should be included from each k-space data set when reconstructing an image. The data are grouped into data segments using the selected temporal window, as indicated at step 712. For instance, a selected number of consecutive projections are grouped into a data segment. The number of projections included in each data segment is determined by the selected temporal window, which can be defined based on the desired temporal resolution for the image reconstruction. As described above, preferably the data are grouped into data segments that are temporally shifted by only a single TR period. Thus, each data segment can be defined by an initial radial projection acquired at an initial time point and by the desired number of radial projections to be included in each data segment. After the k-space data have been grouped into data segments, images are reconstructed from the data segments, as indicated at step 714. A time series of images that depicts the subject as magnetization recovers following the application of the magnetization preparation RF pulses is thus formed. Each image in this time series has a unique image contrast that is determined by the recovery state of the magnetization at which the data in the associated data segment were acquired.

Because this time series of images can be designed to span almost the entirety of the magnetization recovery curve, it is not necessary to prospectively select an inversion time to obtain an image in which signals attributable to a specific tissue are nulled or when contrast between two different tissues is maximized. Rather, because of the high temporal resolution of this data acquisition scheme, such an image can be retrospectively identified in the time series, or spectrum, of images. This feature is highly advantageous for pediatric imaging where the precise inversion time for a child patient may not be readily known. Because children are rapidly developing, there is no consensus on what inversion time to use to achieve a particular tissue nulling or contrast. The lack of consensus is also due to the fact that children's brains do not develop homogeneously, meaning that no single inversion time may be ideal for a given child's entire head. This data acquisition scheme thus provides a solution to this problem by allowing the retrospective identification of an image with the optimal tissue contrast.

The present invention has been described in terms of one or more preferred embodiments, and it should be appreciated that many equivalents, alternatives, variations, and modifications, aside from those expressly stated, are possible and within the scope of the invention.

The invention claimed is:

1. A method that produces at least two images of a subject with a magnetic resonance imaging (MRI) system, the steps of the method comprising:
   a) directing the MRI system in order to perform a double inversion recovery pulse sequence that, during each repetition time (TR) interval, includes:
      i) applying a first magnetization preparation radio frequency (RF) pulse in order to manipulate magnetization attributable to a spin species;
      ii) applying a second magnetization preparation RF pulse in order to further manipulate the magnetization attributable to the spin species;
      iii) acquiring first data after applying the first magnetization preparation RF pulse and before applying the second magnetization preparation RF pulse in order to acquire the first data with a first weighting defined by a recovery state of magnetization following the application of the first magnetization preparation RF pulse; and
      iv) acquiring second data after applying the second magnetization preparation RF pulse timed in order to acquire the second data with a second weighting that differs from the first weighting;
   b) reconstructing at least one image of the subject from the first data with a data processor; and
   c) reconstructing at least one image of the subject from the second data with said data processor;
      wherein the at least one reconstructed image of the subject created form the first data has a different contrast than the at least one reconstructed image of the subject created from the second data due to the second weighting differing from the first weighting.

2. The method as recited in claim 1 in which step a)iii) includes said MRI system applying a plurality of excitation RF pulses such that the first data includes k-space samples obtained while magnetization is recovering to equilibrium following the application of the first magnetization preparation RF pulse.

3. The method as recited in claim 2 in which step b) includes reconstructing from the first data, with said data processor, a plurality of images each having a different image contrast defined by a recovery state of the magnetization recovering in step a)iii).

4. The method as recited in claim 1 in which step a)iv) includes said MRI system applying a plurality of excitation RF pulses such that the second data includes k-space samples obtained while magnetization is recovering to equilibrium following the application of the second magnetization preparation RF pulse.

5. The method as recited in claim 4 in which step c) includes reconstructing from the second data, with said data processor, a plurality of images each having a different image contrast defined by a recovery state of the magnetization recovering in step a)iv).

6. The method as recited in claim 1 in which in the double inversion recovery pulse sequence, the first magnetization preparation RF pulse is a first inversion recovery (IR) RF pulse, and in which the second magnetization preparation RF pulse is a second IR RF pulse.

7. The method as recited in claim 1 in which step b) includes reconstructing with said data processor at least one of a T1-weighted image and a T1 map from the first data.

8. The method as recited in claim 1 in which,
    step b) includes reconstructing from the first data, with said data processor, a plurality of images each having a different image contrast defined by a recovery state of magnetization following the application of the first magnetization preparation RF pulse.

9. The method as recited in claim 1 in which step a)iii) includes said MRI system sampling k-space along a first k-space sampling pattern and step a)iv) includes said MRI system sampling k-space along a second k-space sampling pattern.

10. The method as recited in claim 9 in which the first k-space sampling pattern is different from the second k-space sampling pattern.

11. The method as recited in claim 9 in which the first k-space sampling pattern includes at least one of Cartesian trajectories, radial trajectories, and spiral trajectories, and in which the second k-space sampling pattern includes at least one of Cartesian trajectories, radial trajectories, and spiral trajectories.

12. The method as recited in claim 1 in which a flip angle of the first magnetization preparation RF pulse is different from a flip angle of the second magnetization preparation RF pulse.

13. A method that produces a plurality of images of a subject with a magnetic resonance imaging (MRI) system, the steps of the method comprising:

a) directing the MRI system in order to perform a double inversion recovery pulse sequence that applies a plurality of magnetization preparation radio frequency (RF) pulses in each TR, each magnetization preparation RF pulse rotating magnetization through a flip angle, in which the plurality of magnetization preparation RF pulses applied in step a) with said MRI system include at least a first inversion recovery (IR) RF pulse and a last IR RF pulse;
   b) in each TR, said MRI system also acquiring k-space data after each of the plurality of magnetization preparation RF pulses by applying at least one excitation RF pulse after each of the plurality of magnetization preparation RF pulses and sampling magnetic resonance signals formed in response thereto, wherein the k-space data includes k-space data representative of multiple images of the subject acquired after the first IR RF pulse and k-space data representative of a single image acquired after the last IR RF pulse; and
   c) reconstructing with a data processor, a plurality of images of the subject from the k-space data acquired in step b); with each of the plurality of images that is reconstructed with said data processor, having a different image contrast that is defined by a recovery state of magnetization as the magnetization recovers back to equilibrium.

14. The method as recited in claim 13 in which each of the plurality of magnetization preparation RF pulses are designed to rotate magnetization through a flip angle between and including 90 degrees and 180 degrees.

15. The method as recited in claim 13 in which each of the at least one RF excitation pulses is designed to rotate magnetization through a flip angle at or below 90 degrees.

* * * * *

UNITED STATES PATENT AND TRADEMARK OFFICE
CERTIFICATE OF CORRECTION

PATENT NO. : 10,132,898 B2
APPLICATION NO. : 13/902378
DATED : November 20, 2018
INVENTOR(S) : Steven Ryan Kecskemeti et al.

It is certified that error appears in the above-identified patent and that said Letters Patent is hereby corrected as shown below:

On the Title Page

Item (54), "MRI" should be --MR--.

In the Specification

Column 1, Line 4, "MRI" should be --MR--.

In the Claims

Column 12, Claim 1, Line 36, "processor" should be --processer--.

Column 12, Claim 1, Line 38, "processor" should be --processer--.

Column 12, Claim 3, Line 52, "processor" should be --processer--.

Column 12, Claim 5, Line 63, "processor" should be --processer--.

Column 13, Claim 7, Line 5, "processor" should be --processer--.

Column 14, Claim 13, Line 22, "processor" should be --processer--.

Signed and Sealed this
First Day of January, 2019

Andrei Iancu
*Director of the United States Patent and Trademark Office*